United States Patent
Misra (10) Patent No.: US 8,992,877 B2
(45) Date of Patent: Mar. 31, 2015

(54) METHOD FOR GROWING MONOCRYSTALLINE DIAMONDS

(75) Inventor: Devi Shanker Misra, Mumbai (IN)

(73) Assignees: IIA Technologies Pte. Ltd., Singapore (SG); Indian Institute of Technology Bombay, Mumbai (IN)

( * ) Notice: Subject to any disclaimer, the term of this patent is extended or adjusted under 35 U.S.C. 154(b) by 515 days.

(21) Appl. No.: 12/933,059

(22) PCT Filed: Jun. 18, 2009

(86) PCT No.: PCT/SG2009/000218
§ 371 (c)(1),
(2), (4) Date: Sep. 16, 2010

(87) PCT Pub. No.: WO2009/154577
PCT Pub. Date: Dec. 23, 2009

(65) Prior Publication Data
US 2011/0014112 A1    Jan. 20, 2011

(30) Foreign Application Priority Data
Jun. 18, 2008   (SG) ................. 200804637-7

(51) Int. Cl.
*B01J 3/06* (2006.01)
*C30B 23/00* (2006.01)
*C30B 29/04* (2006.01)
*C30B 25/18* (2006.01)

(52) U.S. Cl.
CPC ............. *C30B 29/04* (2013.01); *C30B 25/18* (2013.01)
USPC .................. 423/446; 117/84; 117/929

(58) Field of Classification Search
CPC ........ C30B 29/04; C30B 25/18; C30B 25/00; C30B 25/16; C30B 25/165
See application file for complete search history.

(56) References Cited

U.S. PATENT DOCUMENTS

| | | | |
|---|---|---|---|
| 5,443,032 A * | 8/1995 | Vichr et al. | 117/84 |
| 2007/0196263 A1* | 8/2007 | Hemley et al. | 423/446 |
| 2008/0156256 A1* | 7/2008 | Linares et al. | 117/101 |
| 2010/0015438 A1* | 1/2010 | Williams et al. | 428/332 |
| 2013/0239615 A1* | 9/2013 | Misra | 63/32 |

* cited by examiner

*Primary Examiner* — Guinever Gregorio
(74) *Attorney, Agent, or Firm* — Berliner & Associates (57) ABSTRACT

A method of forming mono-crystalline diamond by chemical vapor deposition, the method comprising the steps of: (a) providing at least one diamond seed; (b) exposing the seed to conditions for growing diamond by chemical vapor deposition, including supplying reaction gases that include a carbon-containing gas and hydrogen for growing diamond and include a nitrogen-containing gas; and (c) controlling the quantity of nitrogen-containing gas relative to other gases in the reaction gases such that diamond is caused to grow by step-growth with defect free steps without inclusions. The nitrogen is present in the range of 0.0001 to 0.02 vol %. Diborane can also be present in a range of from 0.00002 to 0.002 vol %. The carbon-containing gas can be methane.

12 Claims, 7 Drawing Sheets

METHOD FOR GROWING MONOCRYSTALLINE DIAMONDS

FIELD OF THE INVENTION

The invention relates to growing mono-crystalline diamonds. In particular, the invention relates to growing diamonds by chemical vapour deposition (CVD) processes.

BACKGROUND OF THE INVENTION

Poly-crystalline, as well as mono-crystalline, diamond has been grown using variety of CVD techniques. Poly-crystalline diamond, in spite of having similar properties as mono-crystalline diamonds, is not a potential material for new applications.

For example, thermal conductivity of the poly-crystalline diamond still does not surpass thermal conductivity of natural diamond. Indeed, in poly-crystalline diamond, the grain boundaries inhibit exhibition of superior properties unique to diamond because the grain boundaries act as scattering centres for phonons thereby deteriorating thermal and other properties. The presence of large angle as well as small angle grain boundaries are a major drawback in applications of poly-crystalline diamond.

While there is a clear preference for using mono-crystalline diamonds in applications, mono-crystalline diamonds are difficult to grow with the same texture, clarity, purity and finish as natural diamond. Although, mono-crystalline diamond has superior properties compared to poly-crystalline diamond, microscopic and macroscopic graphitic and non-graphitic inclusions, feathers (long line defects) are very common in CVD grown mono-crystalline diamond. As a result, the potential of CVD grown mono-crystals of diamond to be used as a gem quality product is diminished.

Detailed characterization of defects in mono-crystalline CVD grown diamond by Raman spectroscopy and X-ray diffraction (XRD) reveals that the defects comprise graphitic regions having a size in the range of submicrons and several microns in otherwise mono-crystalline diamond.

Another difficulty in growing mono crystalline CVD diamond is the growth rates. Although the growth rates of 70-100 microns per hour are possible with addition of nitrogen to CVD gases, but defects are prevalent and generally defect density increases with the growth rate.

For example, Derwent abstract of Japanese publication number JP 07277890 discloses a method for synthesizing diamond for use as semi-conductor, electronic or optical components or use in cutting tools. Specifically, the method disclosed in JP 07277890 involves growing diamond in the presence of gas containing nitrogen in a ratio of nitrogen to hydrogen of 3 to 1000 ppm or containing oxygen in a ratio of oxygen to carbon of 3 to 100% to increase growth rates.

A technical paper by Yan et. al. (PNAS, 1 Oct. 2002, Vol. 99, no. 20, 12523-12525) discloses a method or producing mono-crystalline diamond by microwave plasma chemical vapour deposition (MPCVD) at growth rates in the range of 50 to 150 microns per hour.

The method involves a CVD process carried out at 150 torr and involves adding nitrogen to CVD gases to provide a ratio of nitrogen to methane of 1 to 5% $N_2/CH_4$. Yan et. al. believe that nitrogen in the stated ratio enhances growth rates because more available growth sites are created. This is believed to be a result of causing growth to change from <111> crystal planes to <100> crystal planes.

The importance of nitrogen content in CVD gases is recognised in U.S. Pat. No. 5,015,494 (Yamazaki) which teaches a method of growing diamond with customized properties for dedicated applications.

Yamazaki discloses forming diamond by electron cyclotron resonance CVD and discloses adding nitrogen to "prevent lattice defects from growing by virtue of external or internal stress". Nitrogen is added in a ratio of nitrogen-compound gas to carbon-compound gas of 0.1 to 5%. The resultant diamond has a nitrogen concentration of 0.01 to 1 wt %.

Additionally, Yamazaki discloses a requirement to add boron gas to the CVD gases to form boron nitride which deposits on a substrate to improve adhesion to the substrate of formed diamond.

Nitrogen, according to Yan et. al. and Yamazaki, is required for two purposes. Specifically, nitrogen is used to enhance growth rates of CVD grown mono-crystalline diamond and to prevent lattice defects in electron cyclotron resonance CVD grown mono-crystalline diamond.

SUMMARY OF THE INVENTION

It is an object of the present invention to provide a CVD process for growing mono-crystalline diamonds substantially free of defects.

The applicants have carried out extensive experimental work on the role that nitrogen optionally along with the diborane plays in CVD processes for growing mono-crystalline diamond. The experimental work has found that using nitrogen in quantities proposed in Yan et. al. and Yamazaki results in growing diamonds that exhibit nitrogen-based defects such as micro cracks, micro inclusions etc. The experimental work has also found that only very small amounts of nitrogen gas optionally along with diborane, oxygen, and helium in CVD gases will result in substantially defect-free mono-crystalline diamonds of very high quality that are useful for gems and the amount of nitrogen and diborane determined by the applicants to be beneficial are considerably less than the nitrogen to carbon ratio disclosed in Yamazaki.

Specifically, the applicants have found that CVD gases containing more than relatively small amounts of nitrogen and optionally along with diborane in the gas mixture result in diamond being formed with Optical centres related to C—N and C—B—N bonds that lead to the deterioration of the color and purity of the monocrystals of diamond. Large concentrations of nitrogen in the gas mixture lead to the micro inclusions and growth cracks in the crystals. Owing to the difference in bond length between nitrogen-carbon and carbon-carbon, and boron-carbon, the defects operate as phonon scattering centres, thereby diminishing the electrical, optical and mechanical properties of the formed mono-crystalline diamond.

The form of the inclusions is believed to be dependent on the concentration of nitrogen in the CVD gases.

Additionally, the applicants have found that, although a relatively small amount of nitrogen is required, there must be at least some nitrogen optionally along with the diborane gas to be present in the CVD gases to increase the growth rate and advantageously prevent graphitic inclusions forming in diamond deposited by a CVD process.

The invention provides a method of forming mono-crystalline diamond by chemical vapour deposition, the method comprising the steps of:
(a) providing at least one diamond seed;
(b) exposing the seed to conditions for growing diamond by chemical vapour deposition, including supplying reaction gases that include a carbon-containing gas for growing diamond and include a nitrogen-containing gas; and
(c) controlling the quantity of nitrogen-containing gas relative to other gases in the reaction gases such that diamond is caused to grow by step-growth without defects and graphitic inclusions.

The quantity of nitrogen-containing gas in the reaction gases may be in the range of 0.0001 to 0.02 vol %.

The reaction gases can further include diborane.

The diborane can be present in the range of from 0.00002 to 0.002 vol %.

Hence it will be seen that by this invention applicants have found that using relatively small quantities of nitrogen and optionally along with diborane gas in CVD gases cause the growth mechanism of diamond to be a step-growth mechanism, in which a layer of diamond having an edge, defined by a step, grows at the edge as a front. This growth mechanism differs from a layer-growth mechanism that is typical of CVD process and that may result from utilising relatively large quantities of nitrogen in CVD gases.

The mono crystalline diamonds grown by the step-growth mechanism with the quantities of nitrogen and diborane detailed in the application are free of microscopic and macroscopic graphitic inclusions and defects that are associated with growth of diamond by layer-growth, most notably nitrogen-based inclusions. As a result, diamonds grown by step-growth mechanism have enhanced optical, electrical and mechanical properties compared to diamonds grown by layer growth perhaps occurring when large concentrations of nitrogen are used in the gas mixture.

There must be at least some nitrogen included in the CVD gases to avoid graphitic inclusions forming in the grown diamond.

Preferably, the quantity of nitrogen and diborane containing gas in the reaction gases is in the range of 0.00002 to 0.02 vol %.

Preferably, the nitrogen-containing gas is selected from any one or more of the following group: $N_2$ in hydrogen, $N_2$ in oxygen, $N_2$ in helium or $N_2$ in nitrous oxide and $N_2$ with diborane.

Preferably, chemical vapour deposition conditions comprise maintaining the seed at a temperature in the range of 750 to 1200° C.

Preferably, the chemical vapour deposition conditions comprise maintaining the seed at a pressure in the range of 120 to 160 mbar.

Preferably, the carbon-containing gas comprises methane.

Preferably, the reactions gases also comprise hydrogen.

Preferably, chemical vapour deposition occurs in the presence of microwave plasma and occurs with hydrogen in the reactions gases.

Preferably, the reaction gases are in the following relative quantities: The methane 20-80 sccm (standard cubic centimeters per minute), hydrogen 300-800 sccm, nitrogen 0.0005-0.2 sccm, diborane 0.0001-0.01 sccm, oxygen 1-10 sccm. The invention also provides a mono-crystalline diamond of gem quality formed in accordance with the method of the invention.

Preferably, the method is characterised by producing gem quality diamonds.

Preferably the seed should be oriented (100) crystalline orientation.

The diamond grown on the seed up to a thickness of 2 mm is not oriented exactly in (100) crystalline orientation but it loses the orientation and other crystalline orientations are also present.

Figure 10A:
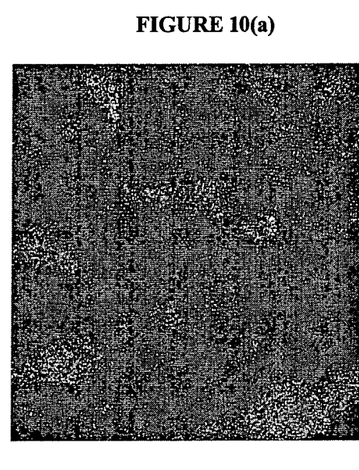
FIG. 10 shows orientation mapping images of (a) CVD, (b) commercial HPHT single crystal diamonds, respectively, and (c) the color coordinate.
Figure 10B:
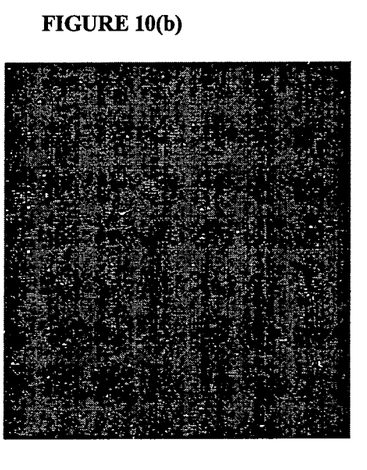
Figure 10C:
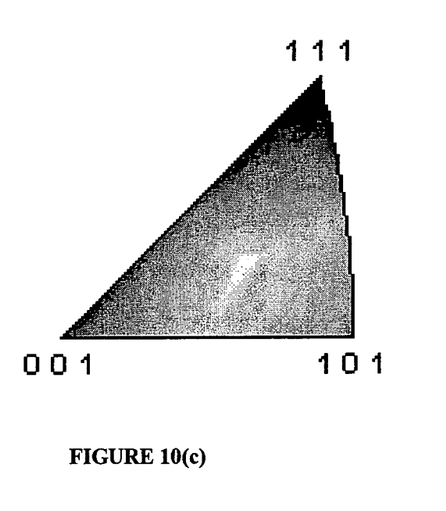

We have checked the crystalline orientation of the diamonds grown up to a thickness >2 mm and find that other crystalline orientations can also be present in small quantity. FIG. 10 shows orientation mapping images of (a) CVD, (b) commercial HPHT single crystal diamonds, respectively, and (c) the color coordinate.

Figure 11A:
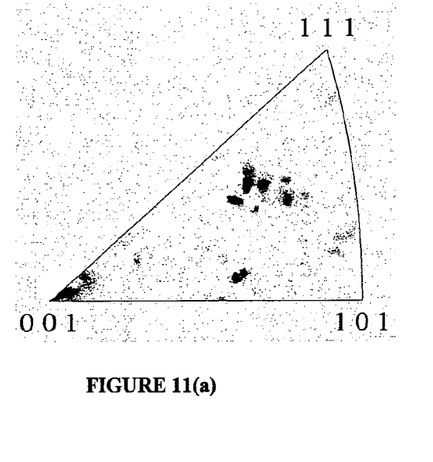
FIG. 11 shows EBSD (100) inverse pole figure of (a) CVD, and (b) HPHT single crystal diamonds.
Figure 11B:
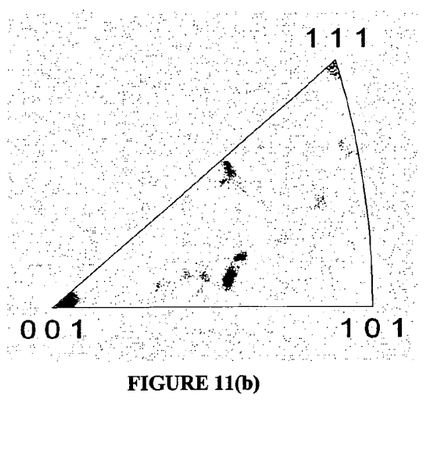

FIG. 11 shows EBSD (100) inverse pole figure of (a) CVD, and (b) HPHT single crystal diamonds. These pictures clearly show that the small regions containing other orientations are also present.

The initial layer of 0.5 mm is however (100) crystallographic orientation and other orientations are absent. As the diamond crystals grow the orientation is lost because grains of small orientations are also formed.

BRIEF DESCRIPTION OF THE DRAWINGS

A preferred embodiment of the invention will now be described, by way of example only, with reference to the accompanying drawings, in which:

In FIG. 4 the image of a sample of diamond grown with 0.03% flow of nitrogen in the flow of the CVD gases. Steps in the growing crystal are evident. The steps are the lines along which the diamond grows in accordance with the invention.

FIG. 5 shows optical microscope images at high magnifications of the diamonds grown in a CVD process including 0.02% nitrogen and 0.001% diborane in accordance with the invention and showing step-growth of diamond. One can see the step growth clearly. However the steps are not clean and straight but uneven and with defects.

FIG. 6 shows optical microscope images at high magnifications of the diamonds grown in a CVD process including 0.02% nitrogen and 0.001% diborane in accordance with the invention and showing step-growth of diamond.

DETAILED DESCRIPTION OF AN EMBODIMENT

A method of growing mono-crystalline diamond in accordance with the invention involves a CVD process that utilises microwave plasma.

Diamond is grown on a substrate comprising a diamond seed that may vary in size between 3×3 mm and 5×5 mm. The method is carried out in a microwave plasma chamber. Depending on the size of the chamber, multiple seeds may be used to grow diamond during a single run of the invention.

The crystallographic orientation of the seeds is determined and seeds having an orientation other than (100) are rejected. Seeds having an orientation of (100) are polished to optical finish with roughness of the order of a micron in preparation for the CVD process.

Once the seeds are located in the chamber, the temperature inside the chamber is increased from ambient temperature to a temperature in the range of 750 to 1200° C. and the pressure inside the chamber is reduced to a pressure in the range of 120 to 160 mbar.

The chamber is supplied with gases for growing diamond and the gases comprise methane ($CH_4$), hydrogen ($H_2$), nitrogen ($N_2$), and helium (He) and are passed through the chamber at a gas flow rate of 30 l/hr. However, the nitrogen gas may be delivered to the chamber in combination with diborane, oxygen, hydrogen and helium.

Nitrogen and diborane gas is supplied in a quantity that comprises 0.0001 to 0.02 vol % of the gases for growing diamond.

An electrical field is applied to surround the seeds such that plasma is generated from the gases in the chamber. The electrical field is generated by a magnetron operating at 6000 Watt and at 2.45 GHz. The generated electrical field causes the hydrogen gas to ionise, thereby forming plasma in the vicinity of the diamond seeds. Under these process conditions, diamond is caused to grow on the diamond seeds.

Figure 3:
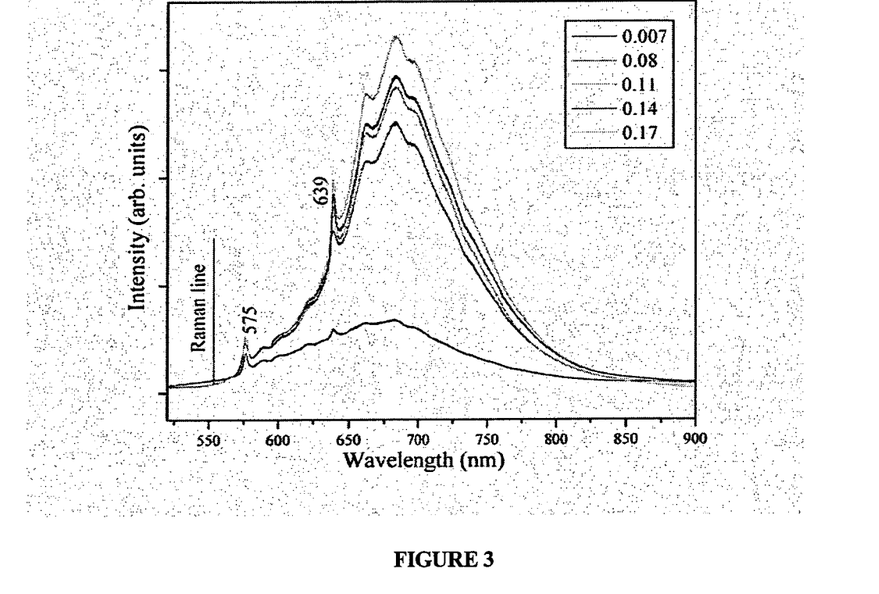
FIG. 3 is a photoluminescence spectrum of diamond deposited in a CVD process in accordance with the invention and utilising nitrogen in the CVD gases in the range of 0.0001 to 0.02 vol % and diborane flow in the mixture is kept 0.00005 to 0.0005%. For the lowest flow on 0.007 sccm (0.0012 vol %) the peak at 575 nm corresponds to nitrogen centre. This shows that the samples produced in accordance with the invention are not nitrogen-free, but have substantially less nitrogen centre defects. The concentration of the defects increase as the nitrogen flow increases in vol %.
Figure 4:
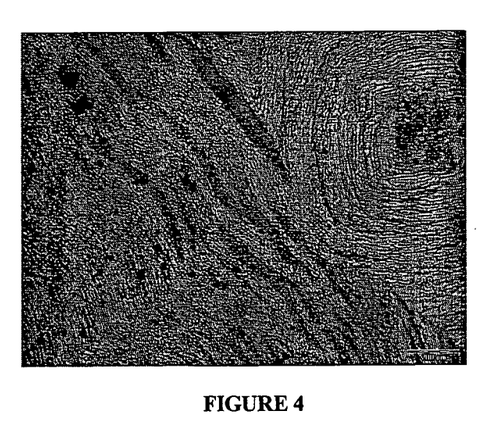
FIGS. 4 to 6 are the optical microscope images at high magnifications of the diamonds grown in a CVD process including 0.02% nitrogen and 0.001% diborane in accordance with the invention and showing step-growth of diamond.
Figure 5:
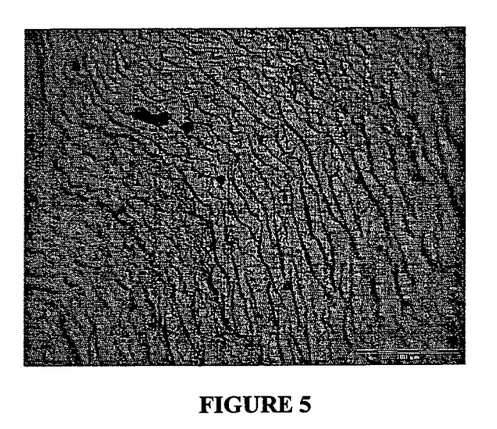

The growth pattern of diamond, as shown in FIGS. 3 to 5, is step-wise and therefore enables diamond to grow that is substantially defect and impurity free.

By way of comparison, the same process conditions were used with the supply of nitrogen being altered to comprise 0.005 to 0.02 vol % of the supplied gases, i.e. nitrogen comprises at least ten times the amount of nitrogen supplied in accordance with the invention.

Figure 1:
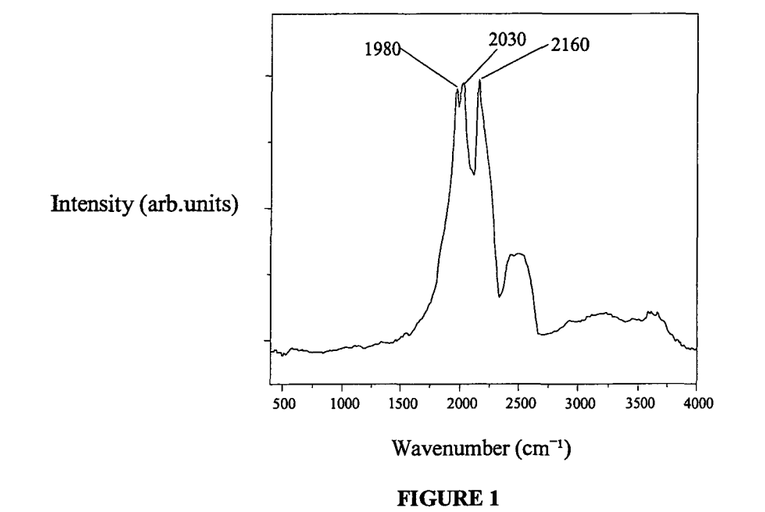
FIG. 1 is a Fourier transform infra-red (FTIR) spectrum of diamond deposited in a CVD process utilising nitrogen in the CVD gases in the range of 0.0002 to 0.002%. The diborane flow in the mixture is kept 0.0001-0.0005%. Note the absence of B-N band and N related peaks in 500-1500 $cm^{-1}$.
Figure 2:
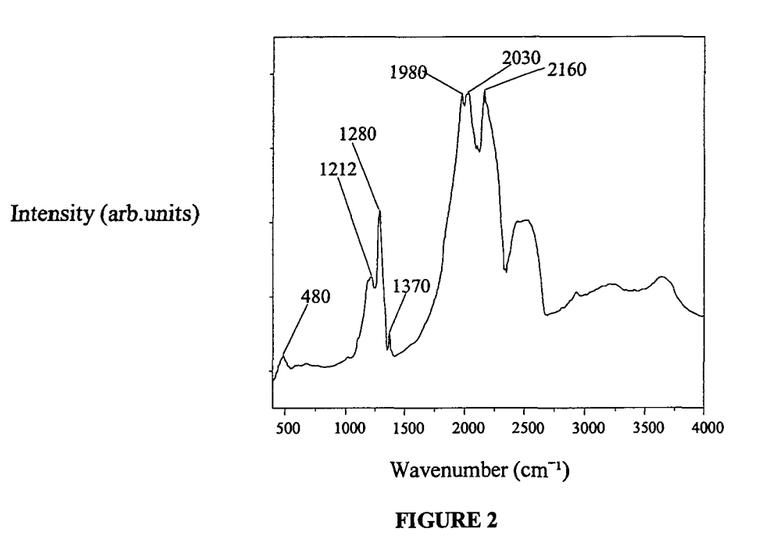
FIG. 2 is an FTIR spectrum of diamond deposited in a CVD process utilising nitrogen in the CVD gases in the range of 0.005 to 0.02% with diborane 0.0008 to 0.001%.

FTIR analysis of samples is used to determine the concentration and bonding of nitrogen and boron in samples. The FTIR spectra of samples grown in accordance with the invention and in accordance with the altered nitrogen supply are shown in FIGS. 1 and 2, respectively.

The FTIR spectrum (FIG. 1) of the diamonds grown in accordance with the invention shows dominant C—C modes at 1978 $cm^{-1}$, 2026 $cm^{-1}$ and 2160 $cm^{-1}$ in the two phonon region. The interesting result, however, is that no nitrogen related bands are observed in the FTIR spectrum of these samples.

The FTIR spectrum (FIG. 2) of samples grown with nitrogen in the range of 0.005 to 0.02% and with diborane 0.0008 to 0.001%, show clear and strong signatures of the boron-nitrogen centres in the samples along with some typical nitrogen centres. Specifically, intense bands related to boron-nitrogen centres are evident at 1370 $cm^{-1}$. The bands at 1210 and 1280 $cm^{-1}$ might belong to nitrogen centres along with the C—C bands at 1978 $cm^{-1}$, 2026 $cm^{-1}$ and 2160 $cm^{-1}$. The nitrogen centres in the diamond samples may exist in many configurations detailed below.

Single atom substitution:

The characteristics peaks in FTIR spectra exist at 1130 and 1350 $cm^{-1}$ and EPR gives a "g" value of 2.0024 for this centre. This centre appears as a weak signature in the samples around 1100 $cm^{-1}$ in the samples grown with nitrogen in the range of 0.005 to 0.02%.

"A" aggregate:

480-490 $cm^{-1}$ and 1282 $cm^{-1}$ are the characteristic peaks of A-aggregate in FTIR. These peaks are evident in FIG. 2 for samples produced with concentrations of nitrogen much greater than for the invention. The A aggregates are also present in natural diamond samples in large concentration which was used as a substrates in the present case.

"B" aggregate:

B-aggregate in diamond is believed to consist of 4/8 nitrogen atoms in pair with carbon atoms. These peaks are evident in natural diamonds mostly and may not be present in samples of the present invention.

N3 Centre:

N3 centre is not FTIR active and, accordingly, does not appear in FIGS. 1 and 2. However, N3 centres show a sharp band at 415 nm in photoluminescence (PL) and UV spectroscopy. This centre consists of three nitrogen atom surrounding a vacancy (V).

Platelets:

Platelets consist of one or two extra atomic layers inserted in the diamond lattice. The nature of the platelets is still be analyzed in detail in diamond lattice. However, the fact that the corresponding IR band is observed only in diamonds containing an appreciable amount of nitrogen suggests that platelet contain nitrogen, and probably consist either partly or entirely of nitrogen. The position of the platelet peak varied from 1354-1384 cm$^{-1}$ from sample to sample. This variation of position is attributed to the susceptibility of the platelets to strain induced into the crystal by the A and B-aggregates defects. The presence of the platelet absorption indicates A-aggregates start to diffuse to form B-aggregates. The platelet peak position is inversely correlated to platelet size.

From the results described above we can conclude that in the samples grown with the flow rates of nitrogen in the range 0.005 to 0.02% the nitrogen is present in the form of single substitution and small concentration of A-aggregates.

Photoluminescence spectroscopy was performed on samples produced with a nitrogen gas flow of 0.0002 to 0.002 vol % and diborane flow of 0.00002 to 0.0005%. The spectroscopy results are shown in FIG. 3 and show peaks at 639 nm (1.94 eV) and 575 nm (2.14 eV) which correspond to N—V and (N—V)$^-$ centres of nitrogen. Accordingly, the samples produced in accordance with the invention are not nitrogen-free, but have substantially less nitrogen centre defects than result from using relatively high concentrations of nitrogen in CVD gas in accordance with Yamazaki. No boron centre is visible in PL spectra as it is possible that boron compensates nitrogen increasing the optical clarity and purity of the diamond single crystals.

Optical microscopy images of the samples grown at nitrogen concentrations in the range according to the invention are shown in images in FIGS. 4 and 5. The images are taken in the range of magnification 500-5000 and the step-wise growth of diamond is evident from the surface of diamond shown in the images.

FIG. 4 is the image of a sample of diamond grown with 0.03% flow of nitrogen in the flow of the CVD gases. Steps in the growing crystal are evident in FIG. 4. The steps are the lines along which the diamond grows in accordance with the invention. The surface morphology of the same sample is evident in FIGS. 5 and 6 in which the high density of the growth steps is clearly evident.

Figure 6:
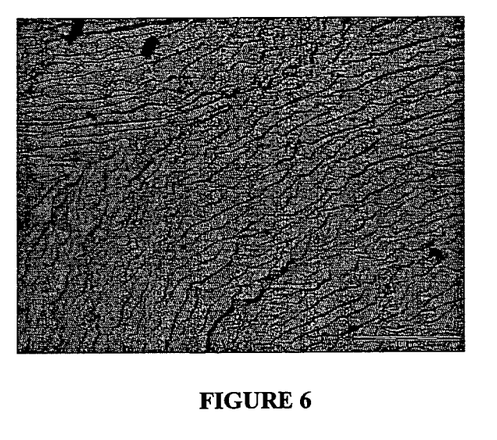

A high density of the growth steps on the surface of a sample grown with nitrogen flow in accordance with the invention is also evident in FIG. 6. These growth steps are present due to the screw dislocation observed in the crystal growth process of a number of materials and are a clear signature that the diamond in accordance with the invention system grows with the help of dislocations and with a step growth mechanism.

Selecting a relatively small quantity of nitrogen in CVD gases ensures that the purity and quality of the diamond is maintained. Selection of a relatively small quantity of nitrogen also causes diamond growth in a step-wise manner, i.e. with a layer of diamond having an edge that grows as a front defined by a step. The occurrence of step-growth is evident in FIGS. 4 to 6.

In the circumstances that less than 0.001 vol % nitrogen is present in CVD gases, diamond grows with graphitic inclusions that detrimentally affect properties of the diamond.

Figure 7:
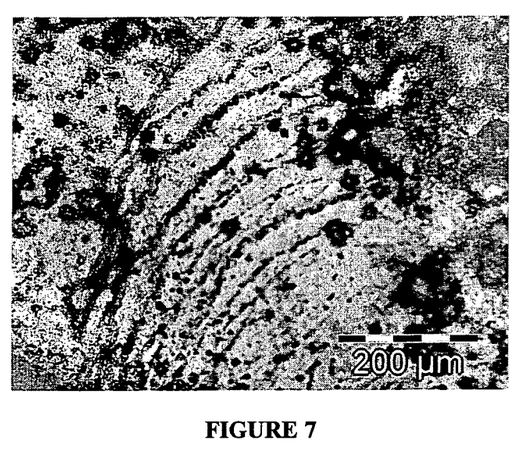
FIGS. 7 and 8 are optical micrographs of diamond deposited in a CVD process utilising the nitrogen in the CVD gases in the amounts of 0.0005 vol % and 0.0008 vol % along with 0.0001% and 0.0002% diborane respectively. The Optical micrographs also show the step growth mechanism of the growth of diamond. The nitrogen is used in quantity lesser than specified by the invention and gives rise to graphitic (black) inclusions in the sample.
Figure 8:
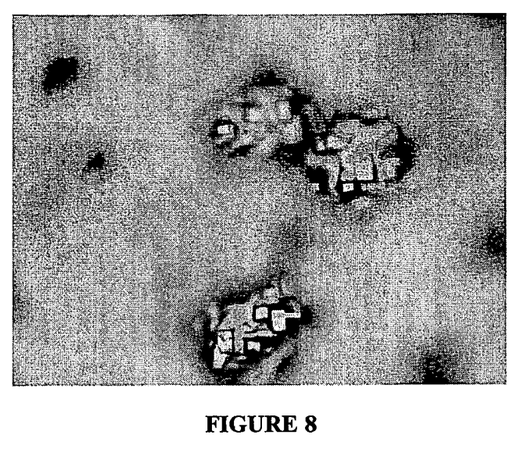

For example, FIGS. 7 and 8 show graphitic (dark) inclusions in CVD grown diamond with 0.0005 vol % and 0.0008 vol % nitrogen without diborane respectively. In each of FIGS. 7 and 8, steps in the layers of diamond are irregular and defective and are believed to be the cause of the graphitic inclusions.

Figure 9:
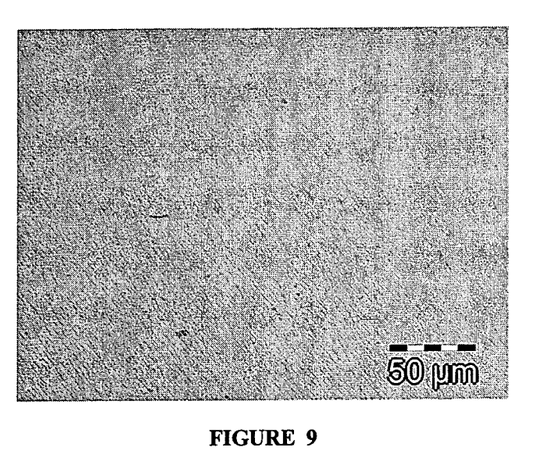
FIG. 9 is an optical micrograph of diamond deposited in a CVD process utilising nitrogen in the CVD gases in the amount of 0.0012 vol % in accordance with the invention. It shows clean growth with no black graphitic inclusions and evenly spaced steps.

In contrast, CVD diamond grown in gas including 0.0012 vol % nitrogen in accordance with the invention with 0.0008% diborane flow includes regular equidistant steps and is substantially free of graphitic inclusions as shown in FIG. 9. It is believed that such diamond results from a CVD process including 0.001 vol % or more nitrogen along with diborane in CVD gas.

Specifically, this threshold volume of nitrogen is believed to be essential to cause the diamond growth with steps clear of impurity and defects.

A concentration of nitrogen higher than 0.0016 vol % in the gas phase results in microscopic and macroscopic graphitic inclusions. Such inclusions and defects adversely affect the properties of the formed diamond. The step-growth mechanism in the nitrogen concentration regime specified in the invention appears to be advantageous because it is less susceptible to incorporating defects and inclusions in the formed diamond, with the result that formed diamond is substantially free of defects and inclusions. Such formed diamond is gem quality and has superior electrical, optical and mechanical properties compared to other forms of diamond grown by CVD and properties that approach the properties of natural diamond.

Reference to any prior art in the specification is not, and should not be taken as, an acknowledgment or any form of suggestion that this prior art forms part of the common general knowledge in Australia or any other country.

Many modifications may be made to the preferred embodiment of the present invention as described above without departing from the spirit and scope of the present invention.

It will be understood that the term "comprises" or its grammatical variants as used in this specification and claims is equivalent to the term "includes" and is not to be taken as excluding the presence of other features or elements.

The invention claimed is:

1. A method of forming mono-crystalline gem grade diamond by chemical vapour deposition, the method comprising the steps of:
   (a) providing at least one diamond seed;
   (b) exposing the seed to conditions for growing diamond by chemical vapour deposition, including supplying reaction gases that include a carbon-containing gas for growing diamond and include a nitrogen-containing gas; and
   (c) controlling the quantity of nitrogen-containing gas relative to other gases in the reaction gases such that diamond is caused to grow by step-growth without defects and graphitic inclusions,
      wherein the quantity of nitrogen-containing gas in the reaction gases is in the range of 0.0002 to 0.002 vol % and further including diborane in the range of from 0.00002 to 0.002 vol % in the reaction gases.

2. A method of forming mono-crystalline gem grade diamond as in claim 1 wherein the nitrogen-containing gas is selected from any one or more of the group comprising nitrogen in hydrogen, nitrogen in oxygen, nitrogen in helium, nitrogen in nitrous oxide or nitrogen with diborane.

3. A method of forming mono-crystalline gem grade diamond as in claim 1 wherein the chemical vapour deposition comprises maintaining the seed at a temperature in the range of 750 to 1200° C.

4. A method of forming mono-crystalline gem grade diamond as in claim 1 wherein the chemical vapour deposition comprises maintaining the seed at a pressure in the range of 120 to 160 mbar.

5. A method of forming mono-crystalline gem grade diamond as in claim 1 wherein the carbon-containing gas comprises methane.

6. A method of forming mono-crystalline gem grade diamond as in claim 1 wherein the reactions gases further comprise hydrogen.

7. A method of forming mono-crystalline gem grade diamond as in claim 1 wherein the chemical vapour deposition occurs in the presence of microwave plasma and with hydrogen in the reactions gases.

8. A method of forming mono-crystalline gem grade diamond as in claim 7 wherein the microwave plasma is generated by a magnetron operating at 6000 Watt and at 2.45 GHz.

9. A method of forming mono-crystalline gem grade diamond as in claim 1 wherein the reaction gases are passed through a reaction chamber at a gas flow rate of approximately 30 l/hr.

10. A method of forming mono-crystalline gem grade diamond as in claim 1 wherein the seed is oriented in the (100) crystalline orientation.

11. A method of forming mono-crystalline gem grade diamond as in claim 1 wherein the reaction gases are in the following relative quantities:
    methane 20-80 sccm (standard cubic centimeters per minute),
    hydrogen 300-800 sccm,
    nitrogen 0.0005-0.2 sccm,
    diborane 0.0001-0.01 sccm; and
    oxygen 1-10 sccm.

12. A method of forming mono-crystalline gem grade diamond as in claim 1 wherein the diamond seed is a size between 3×3 mm and 5×5 mm.

* * * * *